United States Patent
Takada

(10) Patent No.: US 11,688,711 B2
(45) Date of Patent: Jun. 27, 2023

(54) SEMICONDUCTOR DEVICE HAVING SECOND CONNECTOR THAT OVERLAPS A PART OF FIRST CONNECTOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yoshiharu Takada, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/516,019

(22) Filed: Nov. 1, 2021

(65) Prior Publication Data

US 2022/0059494 A1 Feb. 24, 2022

Related U.S. Application Data

(63) Continuation of application No. 16/806,276, filed on Mar. 2, 2020, now Pat. No. 11,195,814.

(30) Foreign Application Priority Data

Jun. 18, 2019 (JP) ................................. 2019-113107

(51) Int. Cl.
*H01L 23/495* (2006.01)
*H01L 23/00* (2006.01)

(52) U.S. Cl.
CPC ........ *H01L 24/33* (2013.01); *H01L 23/49524* (2013.01); *H01L 23/49562* (2013.01);
(Continued)

(58) Field of Classification Search
CPC ......... H01L 23/49524; H01L 23/49562; H01L 24/32; H01L 24/33; H01L 2224/32059;
(Continued)

(56) References Cited

U.S. PATENT DOCUMENTS 8,232,629 B2   7/2012  Koike et al.
9,824,996 B2  11/2017  Satou et al.
(Continued)

FOREIGN PATENT DOCUMENTS

JP   2002043508 A   2/2002
JP   2005026294 A   1/2005
(Continued)

*Primary Examiner* — Hoai V Pham
(74) *Attorney, Agent, or Firm* — Kim & Stewart LLP

(57) ABSTRACT

A semiconductor device includes a first lead portion and a second lead portion spaced from each other in a first direction. A semiconductor chip is mounted to the first lead portion. A first connector has a first portion contacting a second electrode on the chip and a second portion connected to the second lead portion. A second connector has third portion that contacts the second electrode, but at a position further away than the first portion, and a fourth portion connected to the second portion. At least a part of the second connector overlaps a part of the first connector between the first lead portion and the second lead portion.

13 Claims, 9 Drawing Sheets

(52) U.S. Cl.
CPC .... *H01L 24/32* (2013.01); *H01L 2224/32059* (2013.01); *H01L 2224/32175* (2013.01); *H01L 2224/3303* (2013.01); *H01L 2224/33107* (2013.01)

(58) Field of Classification Search
CPC ... H01L 2224/32175; H01L 2224/3303; H01L 2224/33107
USPC .................................................. 257/208, 920
See application file for complete search history.

(56) References Cited

U.S. PATENT DOCUMENTS

2007/0057350 A1    3/2007   Otremba
2014/0374926 A1   12/2014  Miyakawa
2015/0206830 A1*  7/2015   Takada .............. H01L 23/49524
                                                                                 257/676

FOREIGN PATENT DOCUMENTS

| JP | 2008205083 A | 9/2008 |
|----|--------------|--------|
| JP | 2011204886 A | 10/2011 |
| JP | 2012169310 A | 9/2012 |
| JP | 5795282 B2 | 10/2015 |

* cited by examiner

SEMICONDUCTOR DEVICE HAVING SECOND CONNECTOR THAT OVERLAPS A PART OF FIRST CONNECTOR

CROSS-REFERENCE TO RELATED APPLICATIONS

This application is a continuation of U.S. patent application Ser. No. 16/806,276, filed on Mar. 2, 2020, which is based upon and claims the benefit of priority from Japanese Patent Application No. 2019-113107, filed on Jun. 18, 2019, the entire contents of each of which are incorporated herein by reference.

FIELD

Embodiments described herein relate generally to a semiconductor device.

BACKGROUND

Some semiconductor devices, such as power semiconductor devices, are required to have low on-resistance. To decrease on-resistance in such semiconductor devices, there is a method of increasing the contact area of a connector contacting a semiconductor chip with the aim of decreasing package resistance. However, when contact area of the connector is increased, the semiconductor chip may be subjected to increased stress from the connector due to, for example, thermal cycling, so that cracks may be more likely to be generated in the semiconductor chip.

DETAILED DESCRIPTION

Figure 1A:
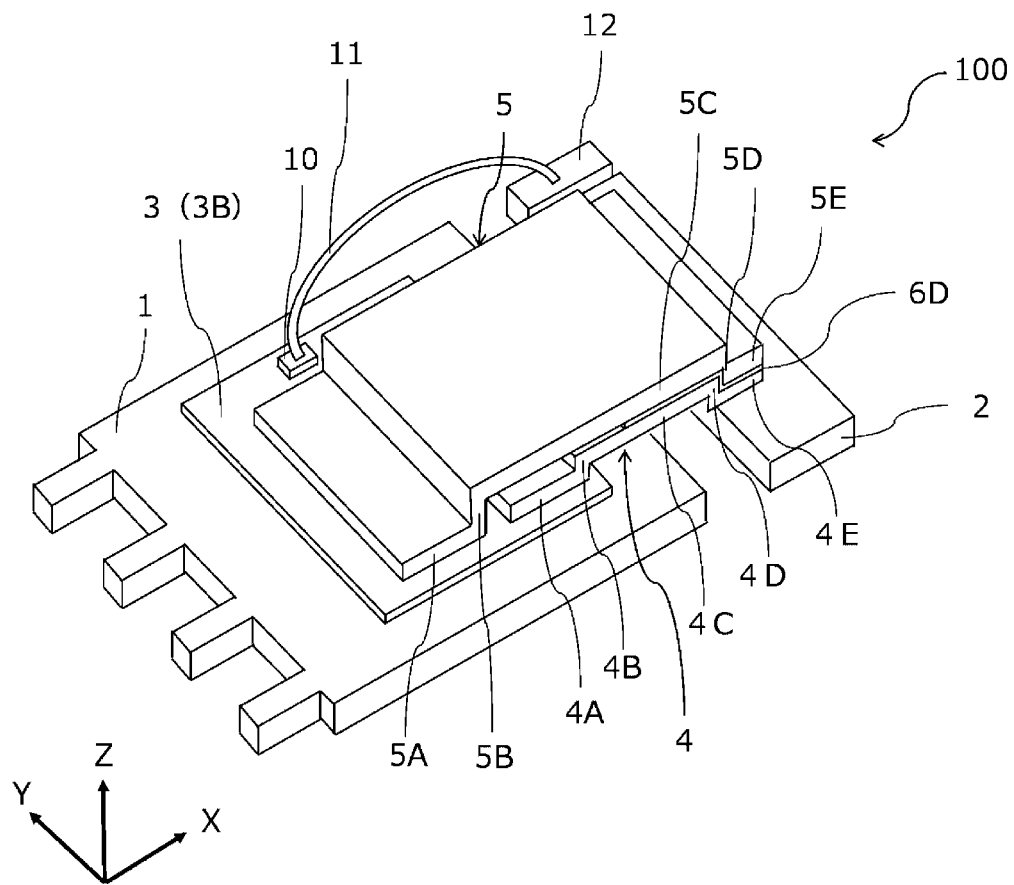
FIG. 1A is a perspective view schematically illustrating a configuration of a semiconductor device according to a first embodiment.

Example embodiments provide a semiconductor device which is capable of reducing the stress to which a semiconductor chip is subjected and thus preventing or reducing crack generation in the semiconductor chip, while still keeping the on-resistance of the semiconductor device low.

In general, according to one embodiment, a semiconductor device includes a first conductive lead portion and a second conductive lead portion spaced from the first conductive lead portion in a first direction. A semiconductor chip is mounted on the first conductive lead portion. The semiconductor chip has a first electrode on a first surface of the semiconductor chip and a second electrode on a second surface, opposite to the first surface, of the semiconductor chip. The first surface faces the first conductive lead portion and the first electrode is electrically connected to the first conductive lead portion. A first connector (also referred to as first bent connector) includes a first connection portion contacting the second electrode and a second connection portion connected to the second conductive lead portion. A second connector (also referred to as a second bent connector) includes a third connection portion contacting the second electrode at a position further away from the second conductive lead portion in the first direction than a position at which the first connection portion contacts the second electrode. A fourth connection portion of the second connector is connected to the second connection portion. At least a part of the second connector overlaps a part of the first connector, in a second direction orthogonal to the first surface, between the first conductive lead portion and the second conductive lead portion.

Hereinafter, certain example embodiments will be described with reference to the drawings. In the following description, the same aspects or components are assigned the same reference characters in the different figures, and repeated description of such components or aspects may be omitted.

Furthermore, in the drawings, the depicted relationships between thickness and width of various elements, or portions, thereof are schematically illustrated do not necessarily reflect or limit those in actual implementations. Likewise, the depicted ratios of sizes between different elements, or portions thereof, in the drawings are also schematically illustrated and are not necessarily to be considered to reflect or limit actual implementations of the present disclosure. Moreover, even when the same portion, element, component, or aspect is illustrated in different drawings, the depicted dimensions or ratios between such may be illustrated differently in the different drawings.

First Embodiment

A semiconductor device 100 according to a first embodiment is described with reference to FIGS. 1A and 1B and FIG. 2.

Figure 1B:
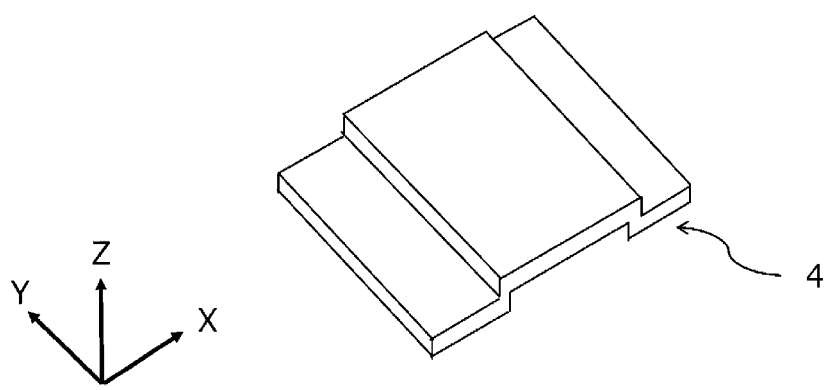
FIG. 1B is a perspective view schematically illustrating a first connector according to a first embodiment.
Figure 2:
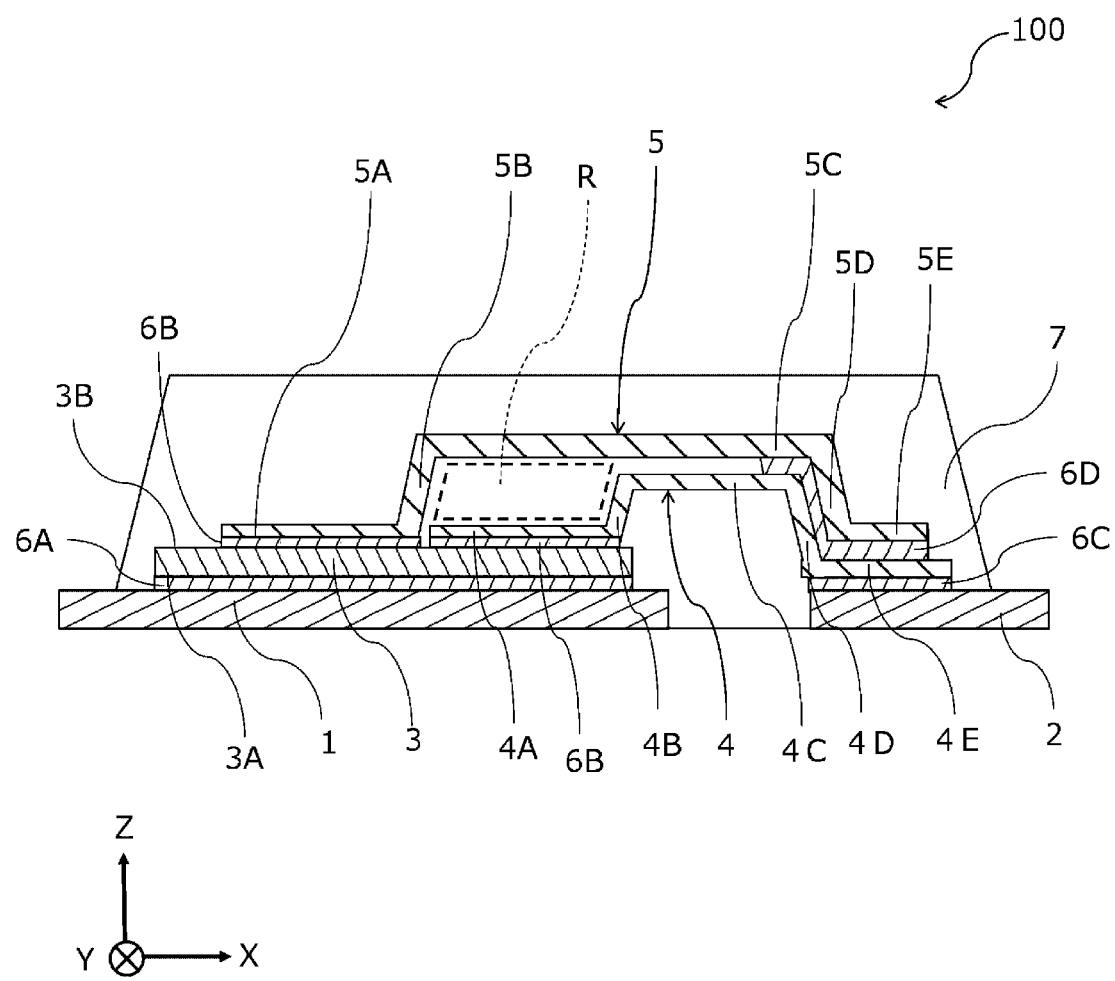
FIG. 2 is a schematic cross-sectional view of a semiconductor device according to a first embodiment.

FIGS. 1A and 1B are perspective views schematically illustrating a configuration of the semiconductor device 100 and a first connector 4 according to the first embodiment. FIG. 2 is a cross-sectional view schematically illustrating a configuration of the semiconductor device 100.

In later drawings referred to in subsequent description, the die bonding materials 6A, 6B, and 6C (see FIG. 2 & FIG. 9) and a sealing material 7 (see FIG. 2 & FIG. 9) may be omitted from the illustration for explanatory convenience, though such aspects should still be understood as present in the depicted examples/embodiments.

The semiconductor device 100 according to the first embodiment includes a first lead portion 1, a second lead portion 2, a third lead portion 12, a semiconductor chip 3, a first connector 4, a second connector 5, a gate pad 10, a bonding wire 11, die bonding materials 6A, 6B, 6C, and 6D, and a sealing material 7.

The first lead portion 1 is a die pad formed in a plate-like shape. The first lead portion 1 includes a first surface and another (second) surface opposite to the first surface. A direction parallel to the first surface and second surface of the first lead portion 1 is referred to as an X-direction, and another direction parallel to the surfaces of the first lead portion 1 but perpendicular to the X-direction is referred to as a Y-direction. The direction perpendicular to the X-direction and the Y-direction is referred to as a Z-direction.

The second lead portion 2 is a lead frame portion or the like formed in a plate-like shape. The second lead portion 2 includes a first surface and another (second) surface opposite to the first surface. The second surface of the second lead portion 2 is located in the same plane as the second surface of the first lead portion 1. The second lead portion 2 is located separate from the first lead portion 1 in the X-direction.

The third lead portion 12 is a lead frame portion or the like formed in a plate-like shape. The third lead portion 12 includes a first surface and another (second) surface opposite to the first surface. The second surface of the third lead portion 12 is located on the same plane as the second surface of the first lead portion 1. The third lead portion 12 is located separate from the first lead portion 1 in the X-direction. The third lead portion 12 is located separate from the first lead portion 1 in the Y-direction.

Each of the first lead portion 1, the second lead portion 2, and the third lead portion 12 is made from, for example, a metallic material, such as copper (Cu), nickel (Ni), aluminum (Al), or silver (Ag), or an alloy including at least any one of these metallic materials. Furthermore, the surfaces of each of the first lead portion 1 and the second lead portion 2 may be subjected to plating or other metallization.

The semiconductor chip 3 is mounted on the first surface (e.g., the upper surface in FIG. 2) of the first lead portion 1. The semiconductor chip 3 is, for example, an insulated-gate bipolar transistor (IGBT) or a metal-oxide-semiconductor field-effect transistor (MOSFET) made from, for example, silicon (Si), silicon carbide (SiC), or gallium nitride (GaN).

The die bonding materials 6A to 6D are conductive materials used to bond members to each other, and are, for example, solder or Ag paste.

The semiconductor chip 3 has two surfaces, one of which surface is provided with a drain electrode 3A of a transistor and the other of which is provided with a source electrode 3B of the transistor. A gate electrode (not separately illustrated) of the transistor is generally provided on the same surface side as the source electrode 3B of the semiconductor chip 3 and is electrically connected to the gate pad 10.

The gate pad 10 is electrically connected to the third lead portion 12 via the electrically conductive bonding wire 11.

The drain electrode 3A, which is provided in this example on a lower surface of the semiconductor chip 3, faces the first surface of the first lead portion 1, and is bonded to the first surface of the first lead portion 1 via the die bonding material 6A. The drain electrode 3A thus electrically contacts the first lead portion 1. In this way, the semiconductor chip 3 is stacked on the first lead portion 1 in the Z-direction.

Here, in this example, the semiconductor chip 3 is a thin chip with a thickness in the Z-direction of, for example, 50 μm to 100 μm.

The first connector 4 and the second connector 5 each function as a source connector which electrically connects the source electrode 3B and the second lead portion 2 to each other. Each of the first connector 4 and the second connector 5 is, for example, a plate made from a metallic material such as Cu (i.e., a copper plate), but the type of the metallic material is not limited to Cu. Moreover, the thickness of each of the first connector 4 and the second connector 5 is typically larger than that of the semiconductor chip 3 and is here, for example, about 100 μm to 300 μm, but is not limited to these values.

The first connector 4 includes a first connection portion 4A, a first separation portion 4B, a first parallel situated portion 4C, a second parallel situated portion 4D, and a second connection portion 4E. As illustrated in the cross-sectional view of FIG. 2 taken along the X-Z plane, the first connection portion 4A, the first separation portion 4B, the first parallel situated portion 4C, the second parallel situated portion 4D, and the second connection portion 4E are sequentially provided from the first connection portion 4A, which is in contact with the source electrode 3B, toward the second connection portion 4E, which is in contact with the second lead portion 2.

Furthermore, in the context of the present specification's description of various parallel portions, the term "parallel situated" in various element/portion names indicates that such an element/portion is situated in parallel with and in proximity to a particular target element or portion thereof. Such an arrangement may be also be referred to as a facing arrangement. For example, the first parallel situated portion 4C is situated in parallel with and in proximity to a particular portion (third parallel situated portion 5C) of the second connector 5, which each extend in the X-direction. The second parallel situated portion 4D is a portion which is to be considered "parallel situated" with a particular portion (fourth parallel situated portion 5D) of the second connector 5 each extending in the Y-direction and which leads from the first parallel situated portion 4C toward the second lead portion 2.

The first connection portion 4A extends in a direction parallel to the second surface of the semiconductor chip 3. A surface of the first connection portion 4A facing the semiconductor chip 3 is located in such a way as to cover a region of the source electrode 3B ranging from the middle thereof to the end thereof closer to the second lead portion 2 in the X-direction, and is bonded to the semiconductor chip 3 via the die bonding material 6B. In other words, the first connection portion 4A electrically contacts the source electrode 3B of the semiconductor chip 3.

The first separation portion 4B extends in a direction which leads from the first lead portion 1 toward the semiconductor chip 3 (e.g., generally in the Z-direction though perhaps with a slant and/or non-vertical component to the direction) from the end of the first connection portion 4A closer to the second lead portion 2 in the X-direction, and thus separates from the semiconductor chip 3. The direction of extension of the first separation portion 4B is not limited to the direction perpendicular to the second surface of the semiconductor chip 3, but may be a direction deviating (slanting) somewhat from such a perpendicular direction.

The first parallel situated portion 4C extends in a direction which leads from the first lead portion 1 toward the second lead portion 2 from the end of the first separation portion 4B. The first parallel situated portion 4C can also or instead extend in a direction inclined from the X-direction.

The second parallel situated portion 4D extends in a direction which leads from the semiconductor chip 3 to the first lead portion 1 from the end of the first parallel situated portion 4C in the X-direction. Furthermore, the direction of extension of the second parallel situated portion 4D is not limited to the direction perpendicular to the second surface of the semiconductor chip 3, but may be a direction deviating (slanting) from such a perpendicular direction.

The second connection portion 4E extends in the X-direction from the end of the second parallel situated portion 4D closer to the second lead portion 2, and the undersurface of the second connection portion 4E is bonded to the second lead portion 2 via the die bonding material 6C. In other words, the second connection portion 4E faces and electrically contacts the second lead portion 2.

The second connector 5 includes a third connection portion 5A, a second separation portion 5B, a third parallel situated portion 5C, a fourth parallel situated portion 5D, and a fourth connection portion 5E. As illustrated in the cross-sectional view of FIG. 2 taken along the X-Z plane, the third connection portion 5A, the second separation portion 5B, the third parallel situated portion 5C, the fourth parallel situated portion 5D, and the fourth connection portion 5E are sequentially provided from the third connection portion 5A, which is in contact with the source electrode 3B, toward the fourth connection portion 5E, which is in contact with the second lead portion 2.

The third connection portion 5A extends in a direction parallel to the second surface of the semiconductor chip 3. A surface of the third connection portion 5A facing the semiconductor chip 3 is located in such a way as to cover a region of the source electrode 3B ranging from the middle thereof to a side thereof farther from the second lead portion 2 in the X-direction, and is bonded to the semiconductor chip 3 via the die bonding material 6B. The third connection portion 5A electrically contacts the source electrode 3B of the semiconductor chip 3. The third connection portion 5A is located separate from the first connection portion 4A in the X-direction.

The second separation portion 5B extends in a direction which leads from the first lead portion 1 toward the semiconductor chip 3 from the end of the third connection portion 5A closer to the second lead portion 2 in the X-direction. Furthermore, the direction of extension of the second separation portion 5B is not limited to the direction perpendicular to the second surface of the semiconductor chip 3, but may be a direction deviating from such a perpendicular direction. The second separation portion 5B is located separate from the first separation portion 4B in the X-direction.

The third parallel situated portion 5C extends in a direction which leads from the first lead portion 1 toward the second lead portion 2 from the end of the second separation portion 5B. The third parallel situated portion 5C is located separate from the first connection portion 4A in the Z-direction. The distance between the third parallel situated portion 5C and the first connection portion 4A is a distance which allows the sealing material 7 described below to penetrate into a space corresponding to the distance, and is, for example, 0.1 mm or more. The third parallel situated portion 5C is provided on the first parallel situated portion 4C in parallel therewith. The third parallel situated portion 5C is located more away from the first lead portion 1 than the first connection portion 4A and the first parallel situated portion 4C in the Z-direction.

Here, while the distance between the first connection portion 4A and the third parallel situated portion 5C is larger than the distance between the first parallel situated portion 4C and the third parallel situated portion 5C, a part of the first connection portion 4A and a part of the first parallel situated portion 4C are set to such a positional relationship as to each overlap portions of the third parallel situated portion 5C as viewed from the Z-direction.

The fourth parallel situated portion 5D extends in a direction which leads from the semiconductor chip 3 to the first lead portion 1 from the end of the third parallel situated portion 5C closer to the second lead portion 2 in the X-direction. Furthermore, the direction of extension of the fourth parallel situated portion 5D is not limited to the direction perpendicular to the second surface of the semiconductor chip 3, but may be a direction deviating from such a perpendicular direction. The fourth parallel situated portion 5D is provided on the second parallel situated portion 4D in parallel therewith.

The fourth connection portion 5E extends in the X-direction from the end of the fourth parallel situated portion 5D closer to the second lead portion 2, and is electrically connected to the second lead portion 2. In FIG. 1, the fourth connection portion 5E extends in a direction which leads from the first lead portion 1 to the second lead portion 2, and is located more away from the second lead portion 2 than the second connection portion 4E in the Z-direction. The fourth connection portion 5E is provided on the second connection portion 4E in parallel therewith. Additionally, in FIG. 1, since the die bonding material 6D is provided between the fourth connection portion 5E and the second connection portion 4E, the fourth connection portion 5E and the second connection portion 4E are electrically connected to each other and are fixed to each other. The fourth connection portion 5E is electrically connected to the second lead portion 2 via the second connection portion 4E. The die bonding material 6D is provided, in addition to between the second connection portion 4E and the fourth connection portion 5E, between the first parallel situated portion 4C and the third parallel situated portion 5C and between the second parallel situated portion 4D and the fourth parallel situated portion 5D.

In general, the method of fixing and electrically connecting the elements of the semiconductor device 100 to each other is not limited to the above-described method. For example, instead of the die bonding materials 6A to 6D being provided in the semiconductor device 100, the elements may be electrically connected and fixed to each other by being swaged or crimped to each other or may be joined by ultrasonic bonding. The fourth connection portion 5E may, in some examples, directly electrically contact the second lead portion 2 rather than via the second connection portion 4E.

Since the first connection portion 4A and the third parallel situated portion 5C are separate from each other and the first separation portion 4B and the second separation portion 5B are separate from each other, a space is formed/left between them. In the subsequent description, the space between the first connection portion 4A and the third parallel situated portion 5C and between the first separation portion 4B and the second separation portion 5B is referred to as a region R.

The sealing material 7 is provided in such a way as to cover apart of the first lead portion 1, apart of the second lead portion 2, the semiconductor chip 3, the first connector 4, and the second connector 5. The sealing material 7 is made from an insulating material, for example, from resin such as epoxy resin or silicone resin. FIG. 2 illustrates a semiconductor device 100 of the half-mold structure in which the sealing material 7 is provided on the one surface of the first lead portion 1, the one surface of the second lead portion 2, and the one surface of the third lead portion 12 in such a way as to cover the semiconductor chip 3, the first connector 4, the second connector 5, the gate pad 10, and the bonding wire 11, and no sealing material 7 is provided on the second surface of the first lead portion 1, the second surface of the second lead portion 2, and the second surface of the third lead portion 12, which are thus left exposed.

The region R, which is a space between portions of the first connector 4 and portions of the second connector 5 located separate from each other, is also filled with the sealing material 7. In this way, since the sealing material 7 contacts both surfaces of the first connector 4 and both surfaces of the second connector 5 and is formed into a complicated shape, the first connector 4 and the second connector 5 are strongly fixed to the sealing material 7. Additionally, the first connector 4 and the second connector 5 are strongly fixed to the semiconductor chip 3 fixed to the sealing material 7. This prevents or reduces the possibility of the first connector 4 and the second connector 5 becoming detached from the semiconductor chip 3 and the sealing material 7.

Figure 8:
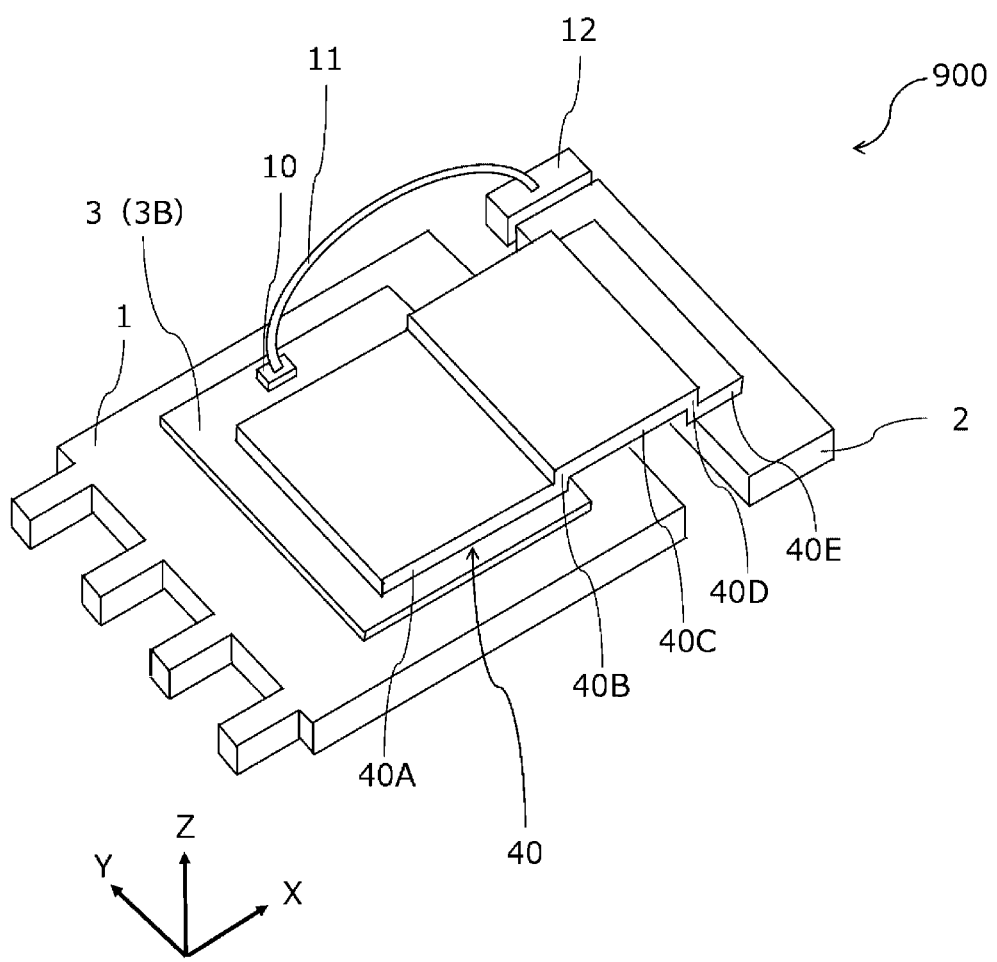
FIG. 8 is a perspective view schematically illustrating a configuration of a semiconductor device according to a comparative example.
Figure 9:
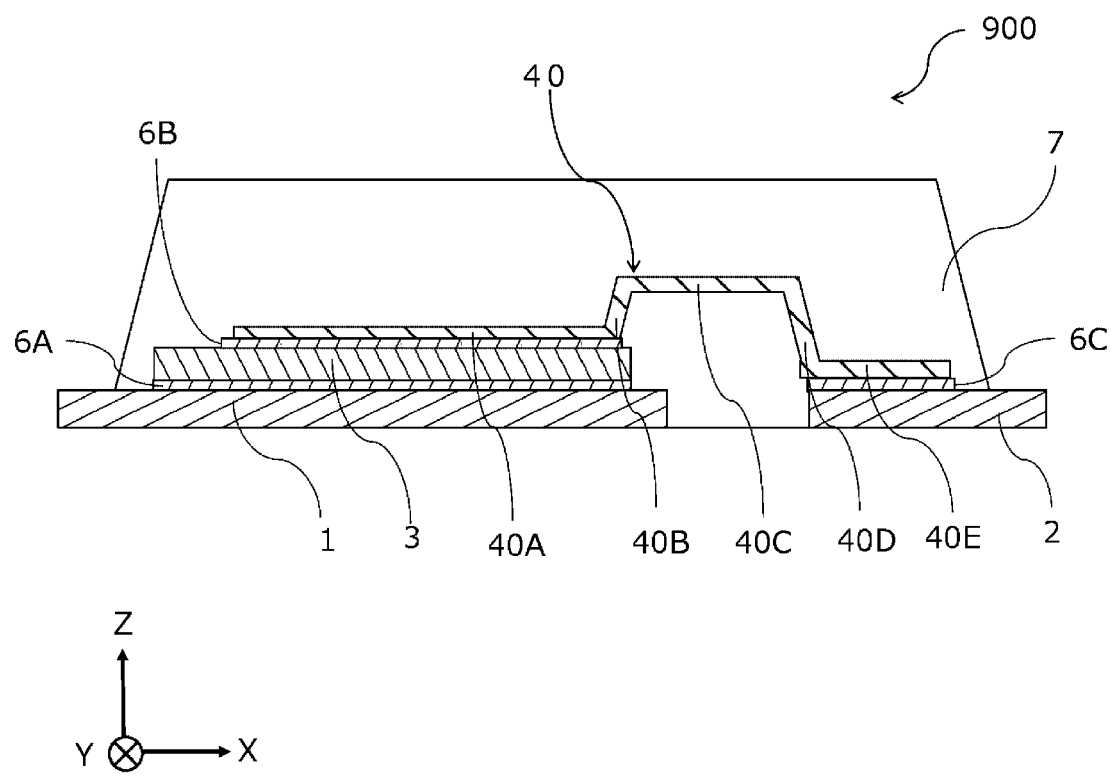
FIG. 9 is a schematic cross-sectional view of a semiconductor device according to the comparative example.

Next, a structure of a semiconductor device 900 according to a comparative example is described with reference to FIG. 8 and FIG. 9. FIG. 8 is a perspective view schematically illustrating a configuration of the semiconductor device 900 according to the comparative example, and FIG. 9 is a cross-sectional view schematically illustrating the configuration of the semiconductor device 900 according to the comparative example.

The comparative example differs from the first embodiment in that a source connector of the semiconductor device 900 according to the comparative example is not configured with a combination of two connectors, i.e., the first connector 4 and the second connector 5, employed in the semiconductor device 100 according to the first embodiment, but configured with only a single connector 40. More specifically, the connector 40 connected to the semiconductor chip 3 of the semiconductor device 900 includes a portion 40A having an area in plan view approximately equal to the area that is obtained by adding together the respective areas, in plan view, of the first connection portion 4A of the first connector 4 and the third connection portion 5A of the second connector 5 in the first embodiment. Furthermore, portions 40A, 40B, 40C, 40D, and 40E of the connector 40 illustrated in FIG. 8 and FIG. 9 each correspond to the first connection portion 4A, the first separation portion 4B, the first parallel situated portion 4C, the second parallel situated portion 4D, and the second connection portion 4E of the first connector 4, respectively.

A stress to which the semiconductor chip 3 is subjected due to a thermal cycle during operations of the semiconductor device 100 and the semiconductor device 900 is described.

Usually, even elements requiring relatively high voltage resistance properties, such as power semiconductor elements including, for example, a MOSFET and an IGBT, are still typically formed in a thin-film manner so as to reduce on-resistance. In the case of semiconductor elements for a lower voltage system, having withstand voltages of several hundred volts, the tendency toward use of thinner films is especially prevalent. When some sort of force, such as internal stress or external stress, is applied to a semiconductor chip 3 formed in a thin-film manner, cracks may be readily generated in such a semiconductor chip 3, so that the semiconductor chip 3 is likely to be broken or to become defective.

Additionally, it is conceivable to increase the area of a portion of the connector portion contacting the source electrode 3B of the semiconductor chip 3 (i.e., a contact portion), as in the semiconductor device 900 according to the comparative example, to decrease on-resistance of a semiconductor device, for example.

However, usually, during an operation of a semiconductor device 900 or the like, heat is generated particularly by the semiconductor chip 3. Since the semiconductor chip 3 and the device members including the connector portion(s) have different coefficients of thermal expansion, the semiconductor chip 3 will be especially subjected to stress during, for example, a temperature rise caused by generation of heat by operations utilizing the semiconductor chip 3. Here, as the contact portion becomes larger, the difference in the amount of thermal expansion between the semiconductor chip 3 and the connector portion becomes larger, so that the stress to which the semiconductor chip 3 is subjected becomes larger. Additionally, as the contact portion becomes larger, the stress is unlikely to be dissipated. Stress to which the semiconductor chip 3 is subjected being larger may cause cracks to be generated in the semiconductor chip 3. Additionally, when stress to which the semiconductor chip 3 is large, this may also cause the connector portion and the source electrode 3B of the semiconductor chip 3 to become detached from each other, thus causing an open-circuit failure.

During a temperature decrease, stress also occurs in the semiconductor chip 3 of the semiconductor device 900 due to the difference between the coefficient of thermal expansion of the semiconductor chip 3 and the coefficient of thermal expansion of the connector portion. Stress occurring during a temperature decrease can include stresses acting in a direction opposite to the direction of the stresses occurring during a temperature rise, though generally these stresses will be of similar magnitudes. Due to thermal cycling in which heat is generated during periodic operations of the semiconductor chip 3, then dissipated (cools) during periods of non-operation, the semiconductor chip 3 contacting the connector portion is repetitively subjected to stresses in different directions (e.g., compressive stress and tensile stress) having similar magnitudes.

In the semiconductor device 100 according to the first embodiment, the contact portion is divided into two distinct portions (the first connection portion 4A and the third connection portion 5A). In the semiconductor device 100, the area of the contact portion (contact area) obtained by adding together contact areas of the first connection portion 4A and the third connection portion 5A is substantially equal to the contact area of the contact portion (the portion 40A) of the semiconductor device 900 in the comparative example. Therefore, the semiconductor device 100 is able to provide low on-resistance equivalent to that of the semiconductor device 900.

Separately, the sizes of each of the first connection portion 4A and the third connection portion 5A in the semiconductor device 100 is less than that of the portion 40A in the comparative example. Moreover, since the first connection portion 4A and the third connection portion 5A are located separate from each other, stresses are less concentrated and thus more likely to be dissipate without generating damage. Therefore, the semiconductor device 100 is able to reduce the stress to which the semiconductor chip 3 is subjected.

As described above, the semiconductor device 100 according to the first embodiment is able to, while keeping on-resistance low, reduce the stress to which the semiconductor chip 3 is subjected and prevent or reduce crack generation in the semiconductor chip 3.

Next, a division of current pathways of the semiconductor device 100 and the semiconductor device 900 is described.

In the semiconductor device 900 in the comparative example, all of the source currents flowing from the semiconductor chip 3 flow through a single source connector (the connector 40). On the other hand, in the semiconductor device 100 in the first embodiment, current pathways from the semiconductor chip 3 divide into two source connectors (i.e., the first connector 4 and the second connector 5).

The areas of respective cross-sections of the connector 40, the first connector 4, and the second connector 5 perpendicular to the direction in which source currents flow are the same. In other words, the cross-sectional area of the entire source connector of the semiconductor device 100 is about two times larger than the cross-sectional area of the source connector of the semiconductor device 900 in the comparative example, so that the resistance value of the entire source connector of the semiconductor device 100 is lower than the resistance value of the source connector of the semiconductor device 900. This decreases on-resistance of the semiconductor device 100 and prevents or reduces heat generation, thus reducing the stress to which the semiconductor chip 3 is subjected due to thermal expansion.

Next, position adjustment to be performed when the second connector 5 is formed on the first connector 4 in a stacked manner in the semiconductor device 100 is described.

Apart of the third parallel situated portion 5C, the fourth parallel situated portion 5D, and the fourth connection portion 5E of the second connector 5 are situated along the surfaces of the first parallel situated portion 4C, the second parallel situated portion 4D, and the second connection portion 4E of the first connector 4. In other words, portions including a part of the third parallel situated portion 5C to the fourth connection portion 5E of the second connector 5 are respectively stacked on and in contact with portions including the first parallel situated portion 4C to the second connection portion 4E of the first connector 4 along the respective surfaces thereof. Furthermore, the die bonding material 6D is used to establish electrical connection between the first connector 4 and the second connector 5 in the stacked portions where the connector 4 and 5 are in contact with each other.

This way enables readily determining a relative positional relationship of the second connector 5 with respect to the first connector 4 and thus preventing a positional deviation between the first connector 4 and the second connector 5.

In the first embodiment, the number of source connector components which contact the semiconductor chip 3 in the X-direction is not limited to two, and three or more connector components may be provided in the source connector components.

As described above, the semiconductor device 100 according to the first embodiment includes at least the first connector 4 and the second connector 5. The first connector 4 and the second connector 5 are in contact with the source electrode 3B of the semiconductor chip 3. Respective parts of the first connector 4 and the second connector 5 are separate from each other, and the region R, which is between the first connector 4 and the second connector 5, is filled with the sealing material 7. This helps prevent the first connector 4 and the second connector 5 from becoming detached from the semiconductor chip 3 and the sealing material 7. During assembly, performing position adjustment by situating a plurality of portions of the third parallel situated portion 5C, the fourth parallel situated portion 5D, and the fourth connection portion 5E along the first parallel situated portion 4C, the second parallel situated portion 4D, and the second connection portion 4E enables preventing a positional deviation between the first connector 4 and the second connector 5 from occurring.

Moreover, in the semiconductor device 100 according to the first embodiment, a contact portion which contacts the semiconductor chip 3 is divided into two contact portions, (e.g., the first connection portion 4A and the third connection portion 5A). Compared with a case where the contact portion is not divided into two portions, while the total area of the two contact portions is set to be almost the same as the comparison case, the area of each of the two contact portions is set to be smaller than the comparison case, so that stress caused by differences in the amount of thermal expansion between the semiconductor chip 3 and each of the first connector 4 and the second connector 5 can be reduced. Accordingly, the semiconductor device 100 is able to prevent or reduce crack generation in the semiconductor chip 3, while keeping on-resistance low.

In the semiconductor device 100, stress occurring between the semiconductor chip 3 and connector portions is reduced, and the sealing material 7 is provided in the region R. Therefore, the connector portions and the source electrode 3B of the semiconductor chip 3 are unlikely to become detached from each other, so that the occurrence of an open-circuit failure of the semiconductor device 100 can be prevented or reduced.

Additionally, during an operation of the semiconductor device 100, source currents are transferred to the first connector 4 and the second connector 5 in a divided manner. Since the cross-section area of a transfer pathway for current increases, the resistance value of a source connector decreases, so that on-resistance of the semiconductor device 100 can be decreased.

Modification Example of First Embodiment

Figure 3A:
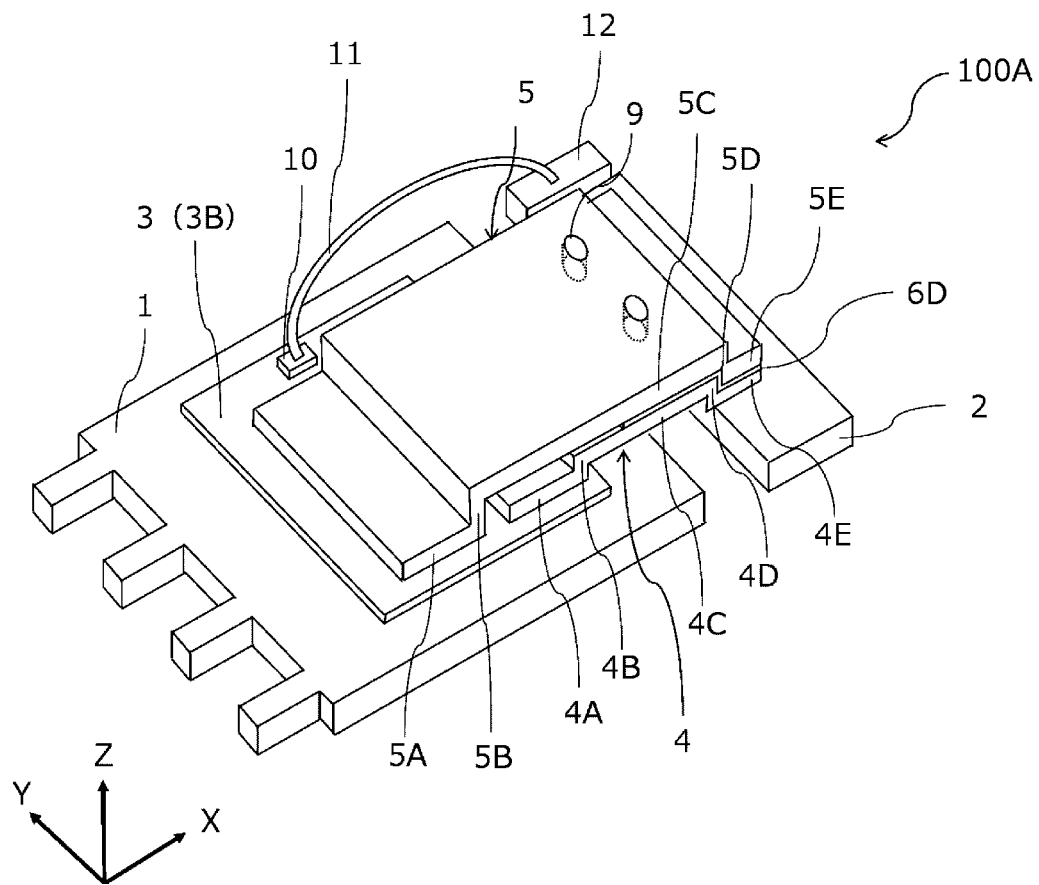
FIG. 3A is a perspective view schematically illustrating a configuration of a semiconductor device according to an example modification of the first embodiment.
Figure 3B:
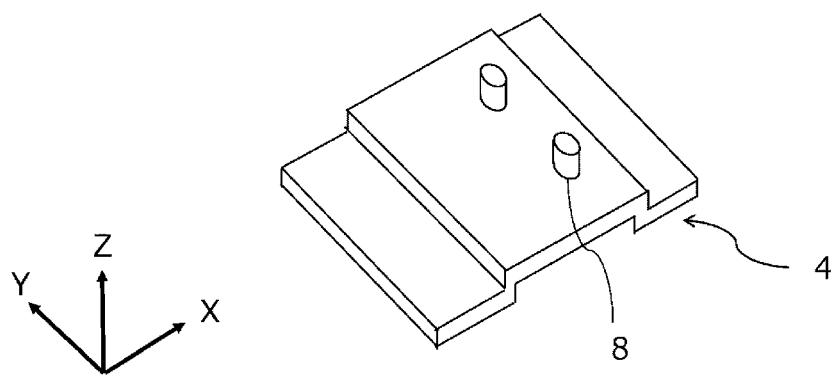
FIG. 3B is a perspective view schematically illustrating a first connector according to an example modification of the first embodiment.

A modification example of the first embodiment is described with reference to FIGS. 3A and 3B. FIGS. 3A and 3B are a perspective view schematically illustrating a configuration of a semiconductor device 100A and a perspective view schematically illustrating a first connector 4 according to a modification example of the first embodiment. The modification example of the first embodiment includes, in addition to the configuration of the first embodiment, "fitting portions" at positions where the first connector 4 and the second connector 5 overlap each other.

The first connector 4 includes at least one first fitting portion 8. The second connector 5 includes at least one second fitting portion 9, which is designed to be fitted on or mated with the first fitting portion 8, at a position at which the second fitting portion 9 overlaps the first fitting portion 8.

Furthermore, while as illustrated in FIGS. 3A and 3B, there are two first fitting portions 8, which are each round raised portions (e.g., posts, columns, pins, etc.) provided on the first parallel situated portion 4C, and two corresponding second fitting portions 9, which are round recessed portions (holes, recesses, voids, etc.) on the third parallel situated portion 5C, the shapes, the number, and the positions of first fitting portions 8 and second fitting portions 9 are not particularly limited to the above-mentioned examples.

In the modification example of the first embodiment, by fitting the first fitting portion 8 into the second fitting portion 9 during assembly position adjustment between the first connector 4 and the second connector 5 is readily performed. This modification of the first embodiment is able to prevent or reduce positional deviations between the first connector 4 and the second connector 5, which may otherwise occur during assembly.

In the semiconductor devices 100 and 100A on-resistance can be reduced while preventing or reducing crack generation in semiconductor chip 3.

Second Embodiment

Figure 4A:
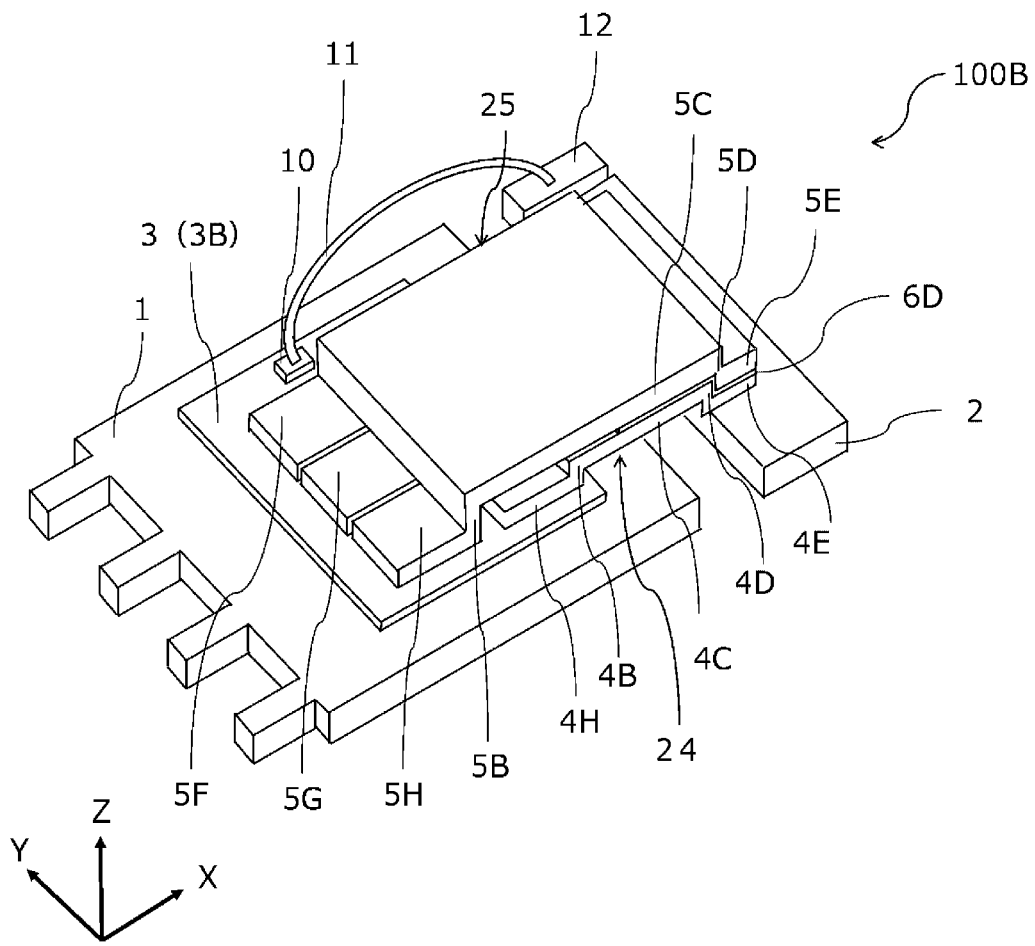
FIG. 4A is a perspective view schematically illustrating a configuration of a semiconductor device according to a second embodiment.
Figure 4B:
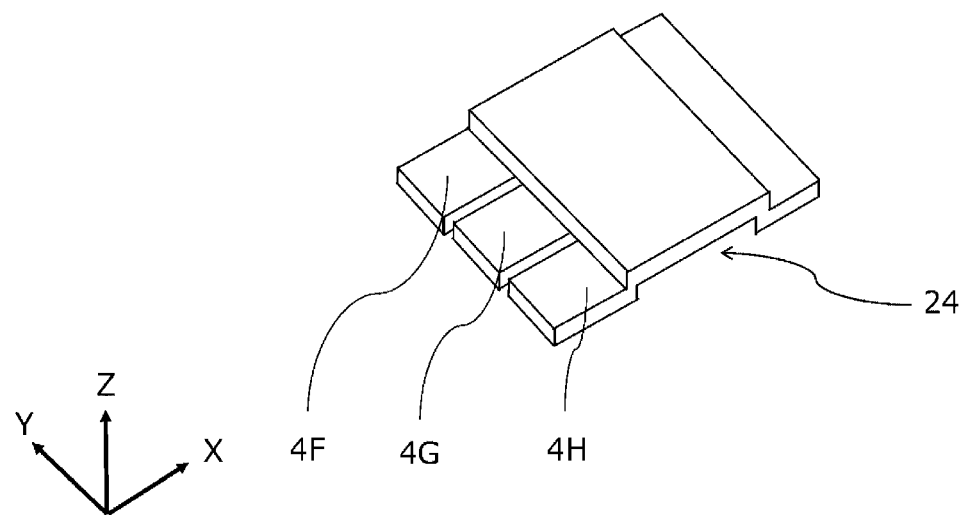
FIG. 4B is a perspective view schematically illustrating a first connector according to a second embodiment.

A semiconductor device 100B according to a second embodiment is described with reference to FIGS. 4A and 4B. FIGS. 4A and 4B are a perspective view schematically illustrating a configuration of the semiconductor device 100B and a perspective view schematically illustrating a first connector portion 24 according to the second embodiment. The semiconductor device 100B according to the second embodiment differs from the first embodiment in that respective portions of the first connector 24 and a second connector 25 contacting the semiconductor chip 3 are each divided into separate portions. In general, the second embodiment otherwise has a configuration, operation, and effect similar to those described in conjunction with the first embodiment and repeated description of these aspects may be omitted from the following description of the second embodiment even though likewise to be understood as also being related to the second embodiment.

The first connector 24 of the semiconductor device 100B has a structure that corresponds to the first connection portion 4A of the first connector 4 in the first embodiment being replaced by a first connection portion 4F, a first connection portion 4G, and a first connection portion 4H. These elements have a structure equivalent to what would be obtained by physically dividing the first connection portion 4A of the first connector 4 into discrete portions separated from each other in the Y-direction. The first connection portions 4F, 4G, and 4H are separate from each other in the Y-direction, and each individually electrically contacts the semiconductor chip 3.

The second connector 25 of the semiconductor device 100B has a structure that corresponds to the third connection portion 5A of the second connector 5 in the first embodiment being replaced by a third connection portion 5F, a third connection portion 5G, and a third connection portion 5H. These elements have a structure equivalent to what would be obtained by physically dividing the third connection portion 5A of the second connector 5 into discrete portions separated from each other in the Y-direction. The third connection portions 5F, 5G, and 5H are separate from each other in the Y-direction, and each individually electrically contacts the semiconductor chip 3.

In other examples, the number of portions into which each of the first connector portion 24 and the second connector portion 25 may be divided is not limited to three, but, in general, may be any number of discrete portions greater than or equal to two.

In the semiconductor device 100B according to the second embodiment, contact portions of source connectors (e.g., the first connector 24 and the second connector 25) contacting the semiconductor chip 3 are divided into a total of six portions (that is, the first connection portions 4F, 4G, and 4H and the third connection portions 5F, 5G, and 5H).

These various contact portions (e.g., 4F, 4G, and 4H and 5F, 5G, and 5H) of the semiconductor device 100B are each separate from each other in at least one direction. Therefore, the semiconductor device 100B is better able to dissipate stress to which the semiconductor chip 3 is subjected in different directions. Since, in general, the possible stress direction is not limited to any one direction, the semiconductor device 100B is better able to prevent or reduce crack generation in semiconductor chip 3.

Modification Example of Second Embodiment

Figure 5A:
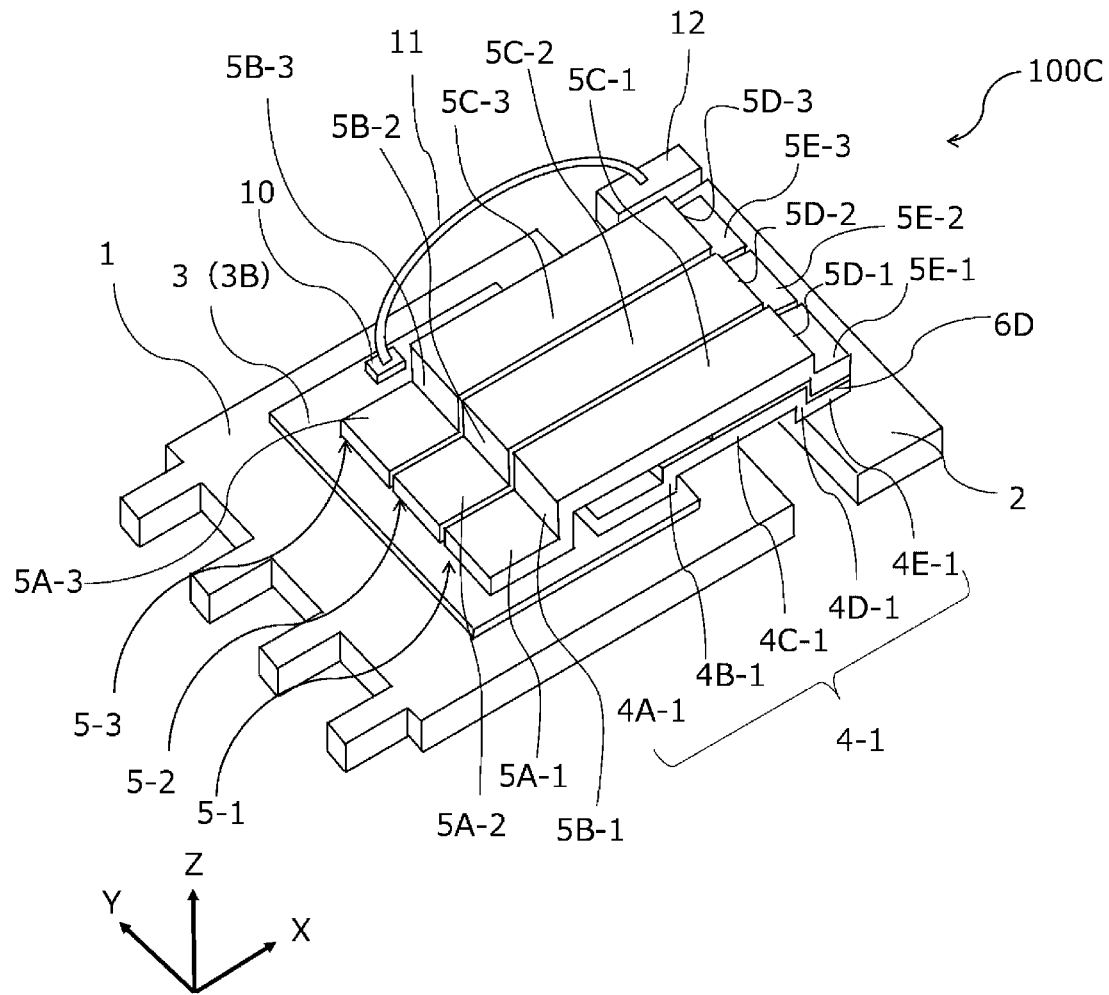
FIG. 5A is a perspective view schematically illustrating a configuration of a semiconductor device according to an example modification of a second embodiment.
Figure 5B:
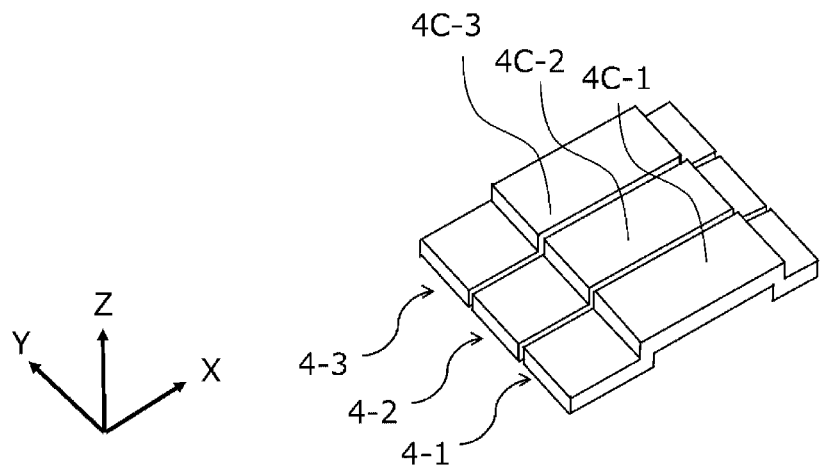
FIG. 5B is a perspective view schematically illustrating a first connector according to an example modification of the second embodiment.

A modification example of the second embodiment is described with reference to FIGS. 5A and 5B. FIGS. 5A and 5B are a perspective view schematically illustrating aspects of a semiconductor device 100C according to a modification example of the second embodiment. The modification of the second embodiment differs from the second embodiment in that the first connector 4 is provided as a plurality of separate components (e.g., first connectors 4-1, 4-2, 4-3) and the second connector 5 is also provided as plurality of separate components (e.g., second connectors 5-1, 5-2, 5-3). That is, the various contact portions contacting the semiconductor chip 3 are divided from each other. In general, this modification of the second embodiment otherwise has a configuration, operation, and effect similar to those already described above in conjunction with the second embodiment and repeated description of these aspects may be omitted from the following description.

In the semiconductor device 100C, the first connector 4 of the first embodiment is replaced by first connectors 4-1, 4-2, and 4-3. Additionally, the second connector 5 of the first embodiment is replaced by second connectors 5-1, 5-2, and 5-3.

The first connectors 4-1, 4-2, and 4-3 of the semiconductor device 100C each have the same structure as the other. Furthermore, first connectors 4-1, 4-2, and 4-3 each individually have a structure in which the respective width in the Y-direction is less than that of the first connector 4 in the first embodiment. In FIG. 5A, the connector sub-portions for first connectors 4-2 and 4-3 are omitted, though each in this example should be understood to include portions corresponding to 4A-1, 4B-1, 4C-1, 4D-1, and 4E-1 which are depicted. Furthermore, each of these sub-portions is to be understood as to respectively correspond to corresponding connector portions (4A, 4B, 4C, 4D, 4E) of a first connector 4 of the first embodiment. In FIG. 5B, the reference labels for first connector sub-portions other than sub-portions 4C-1, 4C-2, 4C-3 are omitted from illustration for improved clarity.

The second connectors 5-1, 5-2, and 5-3 of the semiconductor device 100C each have the same structure. Each has a structure in which the width in the Y-direction is less than that of the second connector 5 of the first embodiment.

With respect to the X-direction and the Z-direction, a positional relationship between the first connector 4-1 and the second connector 5-1, a positional relationship between the first connector 4-2 and the second connector 5-2, and a positional relationship between the first connector 4-3 and the second connector 5-3 are equivalent to a positional relationship between the first connector 4 and the second connector 5 in the first embodiment. The first connectors 4-1, 4-2, and 4-3 are separate from each other in the Y-direction.

In semiconductor device 100C, a plurality of first connectors (e.g., 4-1, 4-2, 4-3) and a plurality of second connectors (e.g., 5-1, 5-2, 5-3) are provided. Contact portions in the semiconductor device 100C are separate from each other in the X-direction and the Y-direction. This helps prevent or reduce crack generation in the semiconductor chip 3. According to this modification example of the second embodiment, as with the second embodiment, crack generation in the semiconductor chip 3 is suppressed.

In the second embodiment and the modification example of the second embodiment, may be considered in some instances to more effectively reduce or prevent crack generation than the first embodiment.

In further modifications, the second embodiment and the modification example of the second embodiment, at least one first fitting portion 8 can be provided on a first connector and at least one second fitting portion 9 can be provided on a corresponding second connector similar to the semiconductor device 100A according to the modification example of the first embodiment.

Figure 6A:
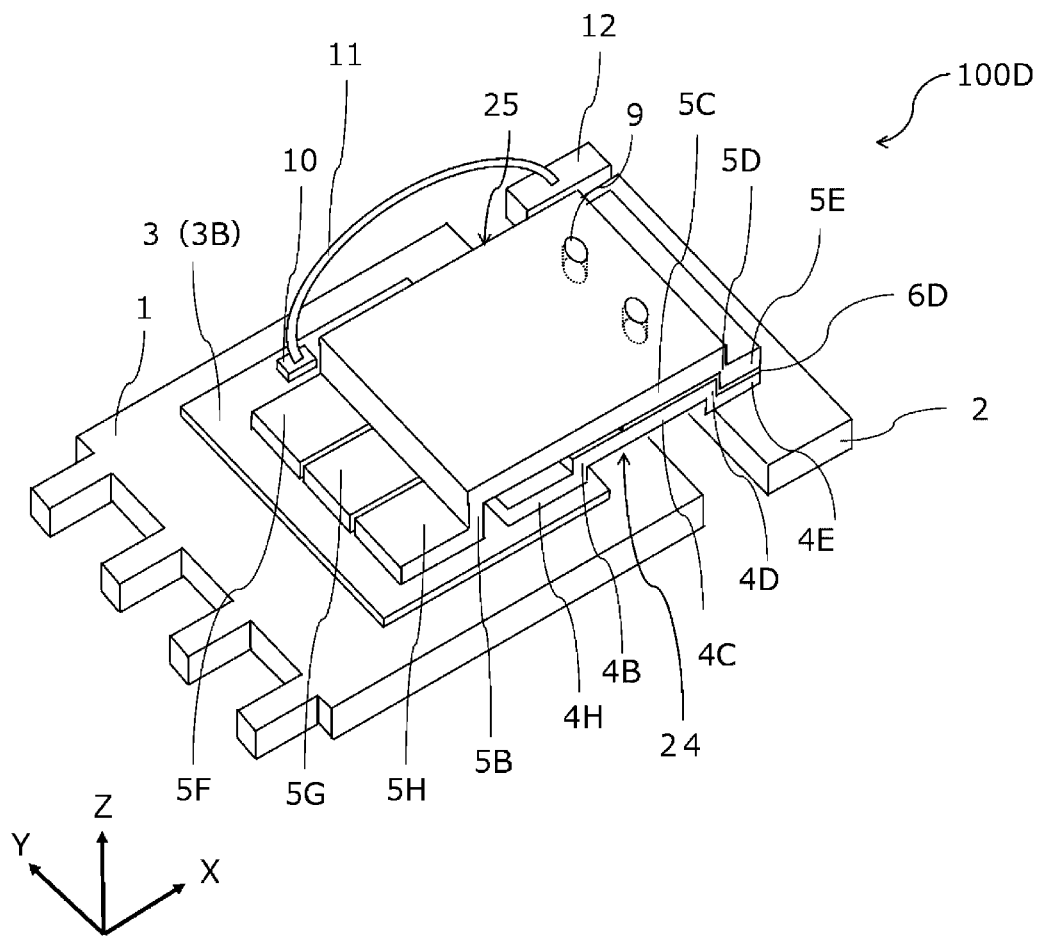
FIG. 6A is a perspective view schematically illustrating a configuration of a semiconductor device including fitting portions according to a second embodiment.
Figure 6B:
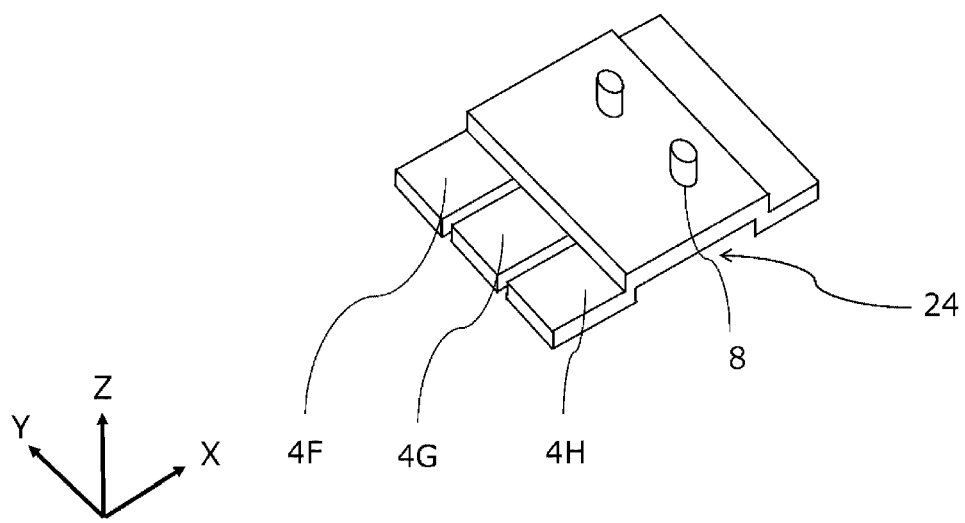
FIG. 6B is a perspective view schematically illustrating a first connector including first fitting portions according to a second embodiment.

FIG. 6A is a perspective view schematically illustrating a configuration of a semiconductor device according to the second embodiment incorporating fitting portions (e.g., first fitting portions 8 and second fitting portions 9). FIG. 6B is a perspective view schematically illustrating a first connector 24 including first fitting portions 8.

Figure 7A:
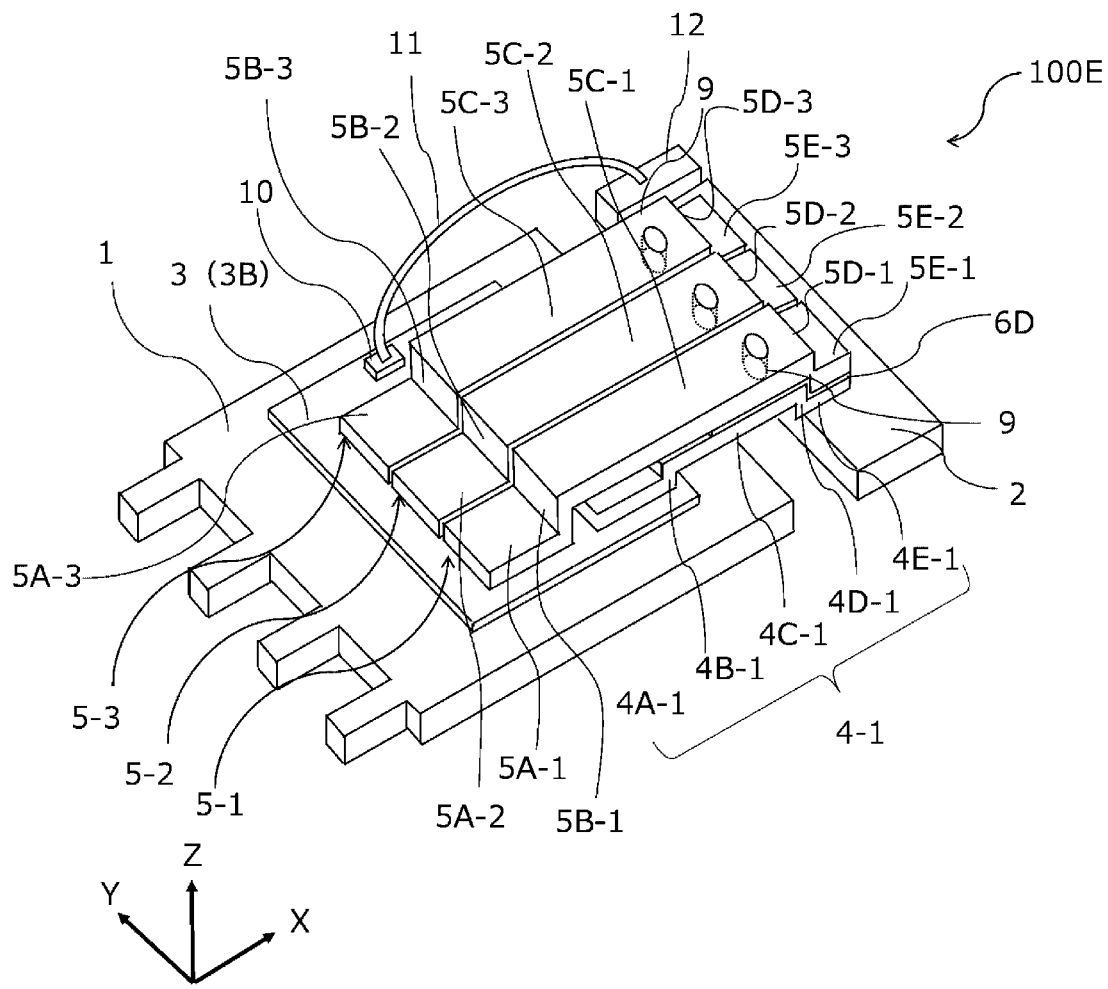
FIG. 7A is a perspective view schematically illustrating a configuration of a semiconductor device including fitting portions according to an example modification of the second embodiment.
Figure 7B:
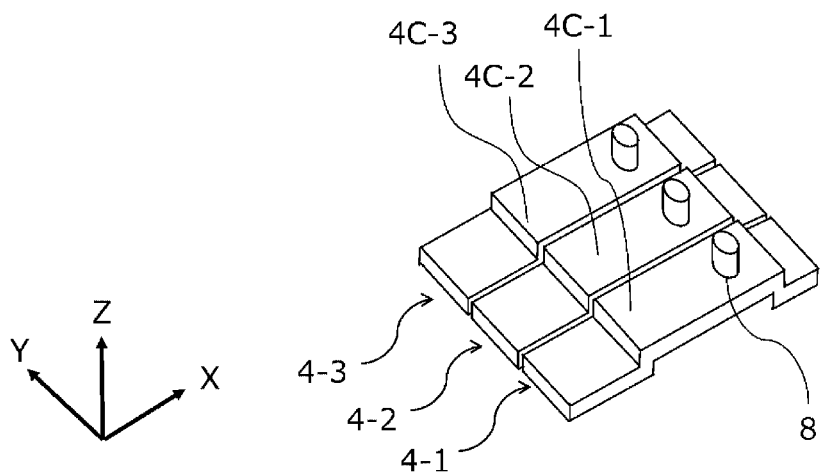
FIG. 7B is a perspective view schematically illustrating a first connector including first fitting portions according to an example modification of the second embodiment.

FIG. 7A is a perspective view schematically illustrating a configuration of a semiconductor device according to the modification example of the second embodiment that includes fitting portions (e.g., first fitting portions 8 and second fitting portions 9). FIG. 7B is a perspective view schematically illustrating first connectors 4-1, 4-2, and 4-3 according to the modification example of the second embodiment further including first fitting portions 8.

In the semiconductor devices 100D and 100E include fitting portions 8/9, but otherwise correspond to the second embodiment and the modification example of the second embodiment described above. Incorporation of a first fitting portion 8 and a second fitting portion 9 in this context enables positional alignment between the first connector(s) and the second connector(s) during assembly. This reduces or prevents positional deviations during assembly.

According various embodiments described above, a source connector of a semiconductor device includes a first connector and a second connector, and the contacting portions of the source connector contacting the semiconductor chip can be divided. Decreasing the size of each contact portion of each connector while maintaining the total area of the contact portions enables the semiconductor device to reduce stress caused by differences in thermal expansion between the semiconductor chip 3 and the source connector. Additionally, during operation of the semiconductor device, source currents are divided between the first connector(s) and the second connector(s). Since the cross-sectional area of the transfer pathway of current is increased, the resistance value of the source connector decreases, so that on-resistance of the semiconductor device 100 can be decreased. In this way, according to the present disclosure, a semiconductor device can keep on-resistance low while reducing stress to which the semiconductor chip is subjected and therefore preventing or reducing crack generation.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A packaged semiconductor device, comprising:
a first lead frame;
a semiconductor chip mounted on the first lead frame, the semiconductor chip having a first electrode facing the first lead frame and electrically connected to the first lead frame, a second electrode of the semiconductor chip facing away from the first lead frame;
a first connector comprising a first edge and a second edge, the first connector extending from the first edge to the second edge in a first direction, the first edge contacting the second electrode at a first position; and
a second connector comprising a third edge and a fourth edge, the second connector extending from the third edge to fourth edge in the first direction, the third edge contacting the second electrode at a second position farther away from the fourth edge of the second connector in the first direction than the third edge of the second connector, wherein
the second connector includes a portion that overlaps a portion of the first connector.

2. The packaged semiconductor device according to claim 1, wherein the portion of the second connector that overlaps the portion of the first connector includes a first portion that extends in a direction parallel to the first direction and a second portion that extends in a direction intersecting the first direction.

3. The packaged semiconductor device according to claim 1, further comprising:
a sealing resin, wherein
a portion of the sealing resin is between the first connector and the second connector at position above the second electrode.

4. The packaged semiconductor device according to claim 1, wherein a contact portion of the first connector that is contacting the second electrode is divided into a plurality of portions spaced from each other in a direction parallel to a surface of the second electrode and perpendicular to the first direction.

5. The packaged semiconductor device according to claim 1, wherein
the first connector includes a first post element,
the second connector includes a first recess element, and
the first post element is fitted into the first recess element.

6. The packaged semiconductor device according to claim 1, wherein a height of the semiconductor chip is less than a thickness of the first connector.

7. The packaged semiconductor device according to claim 1, wherein the second edge of the first connector is connected to the fourth edge of the second connector.

8. A packaged semiconductor device, comprising:
a first lead frame;
a semiconductor chip mounted on the first lead frame, the semiconductor chip having a first electrode facing the first lead frame and electrically connected to the first lead frame, a second electrode of the semiconductor chip facing away from the first lead frame;
a first connector comprising a first connection portion and a second connection portion, the first connector extending from the first connection portion to the second connection portion in a first direction, the first connection portion contacting with the second electrode at a first position; and a second connector comprising a third connection portion, the second connector extending from the third connection portion in the first direction, the third connection portion contacting with the second electrode at a second position further away from the second connection portion of the first connector in the first direction than the third connection portion of the second connector, wherein the second connector includes a portion that overlaps a portion of the first connector, and the second connection portion of the first connector is connected to the second connector.

9. The packaged semiconductor device according to claim 8, wherein the portion of the second connector that overlaps the portion of the first connector includes a first portion that extends in a direction parallel to the first direction and a second portion that extends in a direction intersecting the first direction.

10. The packaged semiconductor device according to claim 8, further comprising:

a sealing resin, wherein a portion of the sealing resin is between the first connector and the second connector at position above the second electrode.

11. The packaged semiconductor device according to claim 8, wherein a contact portion of the first connector that is contacting the second electrode is divided into a plurality of portions spaced from each other in a direction parallel to a surface of the second electrode and perpendicular to the first direction.

12. The packaged semiconductor device according to claim 8, wherein the first connector includes a first post element, the second connector includes a first recess element, and the first post element is fitted into the first recess element.

13. The packaged semiconductor device according to claim 8, wherein a height of the semiconductor chip is less than a thickness of the first connector.

* * * * *